United States Patent
Yang et al.

(10) Patent No.: US 11,013,121 B2
(45) Date of Patent: May 18, 2021

(54) DISPLAY DEVICE, CIRCUIT BONDING STRUCTURE, AND CIRCUIT BONDING METHOD

(71) Applicants: BOE TECHNOLOGY GROUP CO., LTD., Beijing (CN); BOE (HEBEI) MOBILE DISPLAY TECHNOLOGY CO., LTD., Hebei (CN)

(72) Inventors: Zhifu Yang, Beijing (CN); Zhiyang Cui, Beijing (CN); Dahua Zhu, Beijing (CN); Lei Zhao, Beijing (CN)

(73) Assignees: BOE Technology Group Co., Ltd., Beijing (CN); BOE (Hebei) Mobile Display Technology Co., Ltd., Hebei (CN)

( * ) Notice: Subject to any disclaimer, the term of this patent is extended or adjusted under 35 U.S.C. 154(b) by 254 days.

(21) Appl. No.: 16/301,397

(22) PCT Filed: Mar. 22, 2018

(86) PCT No.: PCT/CN2018/080083
§ 371 (c)(1),
(2) Date: Nov. 13, 2018

(87) PCT Pub. No.: WO2018/223750
PCT Pub. Date: Dec. 13, 2018

(65) Prior Publication Data
US 2021/0022251 A1    Jan. 21, 2021

(30) Foreign Application Priority Data

Jun. 5, 2017  (CN) .......................... 201710412978.2

(51) Int. Cl.
*H05K 1/18* (2006.01)
*H05K 3/30* (2006.01)

(52) U.S. Cl.
CPC ............. *H05K 1/189* (2013.01); *H05K 1/181* (2013.01); *H05K 3/301* (2013.01); *H05K 2201/10128* (2013.01)

(58) Field of Classification Search
CPC ....................................................... H05K 1/189
(Continued)

(56) References Cited

U.S. PATENT DOCUMENTS

2018/0047315 A1* 2/2018 Li ............................ H01L 24/01
2018/0310404 A1* 10/2018 Lim ....................... H05K 1/028

FOREIGN PATENT DOCUMENTS

CN       203365865 U    12/2013
CN       105118386      * 12/2015
(Continued)

OTHER PUBLICATIONS

Chinese Office Action dated Dec. 13, 2018, from application No. 201710412978.2.
(Continued)

*Primary Examiner* — Stanley Tso
(74) *Attorney, Agent, or Firm* — Arch & Lake LLP

(57) ABSTRACT

The present disclosure relates to a circuit bonding structure, a circuit bonding method, and a display device. The circuit bonding structure includes a carrying portion configured to carry a driving circuit and having two sides which are adjacent to each other and form a preset acute angle and a preset circuit board having a bonding region having two sides which are adjacent to each other and form a preset acute angle. The driving circuit is bonded to the bonding region by the carrying portion.

6 Claims, 4 Drawing Sheets

(58) Field of Classification Search
USPC .......................................................... 361/760
See application file for complete search history.

(56) References Cited

FOREIGN PATENT DOCUMENTS

| | | |
|---|---|---|
| CN | 105118386 A | 12/2015 |
| CN | 105720028 A | 6/2016 |
| CN | 105931572 A | 9/2016 |
| CN | 106098723 A | 11/2016 |
| CN | 107241858 A | 10/2017 |
| JP | 2010-204535 A | 9/2010 |
| TW | I561137 * | 1/2016 |
| TW | I561137 B | 12/2016 |
| TW | 201703606 A | 1/2017 |

OTHER PUBLICATIONS

International Search Report and Written Opinion dated Jun. 22, 2018, from application No. PCT/CN2018/080083.

\* cited by examiner

DISPLAY DEVICE, CIRCUIT BONDING STRUCTURE, AND CIRCUIT BONDING METHOD

CROSS REFERENCE

The present application is a continuing application of International Application No. PCT/CN2018/080083, filed on Mar. 22, 2018, which is based upon and claims priority to Chinese Patent Application No. 201710412978.2, filed on Jun. 5, 2017, and the entire contents thereof are incorporated herein by reference.

TECHNICAL FIELD

The present disclosure relates to the field of packaging technology, and in particular, to a display device, a circuit bonding structure, and a circuit bonding method.

BACKGROUND

As the market demand for ultra-narrow bezel in the display industry increases, integrated circuit packaging technologies for this demand have also been developed.

In the related art, bonding a driving circuit to a display panel is changed to bonding the driving circuit to a preset circuit board such as a flexible printed circuit (FPC), which reduces the occupation of the display panel space by the driving circuit, therefore realizing a relatively narrow border or bezel.

SUMMARY

According to a first aspect of the present disclosure, there is provided a circuit bonding structure. The circuit includes a carrying portion configured to carry a driving circuit and having two sides which are adjacent to each other and form a preset acute angle and a preset circuit board having a bonding region having two sides which are adjacent to each other and form a preset acute angle. The driving circuit is bonded to the bonding region by the carrying portion.

According to a second aspect of the present disclosure, a circuit bonding method is provided for bonding a driving circuit to a preset circuit board, including determining whether an effective contact area of a carrying portion for carrying the driving circuit and a bonding region of the preset circuit board is smaller than a preset value, wherein each of the carrying portion and the bonding region has two sides which are adjacent to each other and form a preset acute angle, responsive to determining that that the effective contact area is smaller than the preset value, adjusting a position of the carrying portion in a direction perpendicular to one of the sides which form the preset acute angle to increase the effective contact area to be greater than the preset value, and bonding the driving circuit to the preset circuit board by the carrying portion.

According to a third aspect of the present disclosure, a display device is provided including the circuit bonding structure according to the above first aspect.

It should be understood that the above general description and the following detailed description are merely exemplary and explanatory, and are not limiting of the present disclosure.

BRIEF DESCRIPTION OF THE DRAWINGS

The accompanying drawings, which are incorporated in the specification and constitute a part of the specification, show exemplary arrangements of the present disclosure. The drawings along with the specification explain the principles of the present disclosure. It is apparent that the drawings in the following description show only some of the arrangements of the present disclosure, and other drawings may be obtained by those skilled in the art without departing from the drawings described herein.

DETAILED DESCRIPTION

Figure 1:
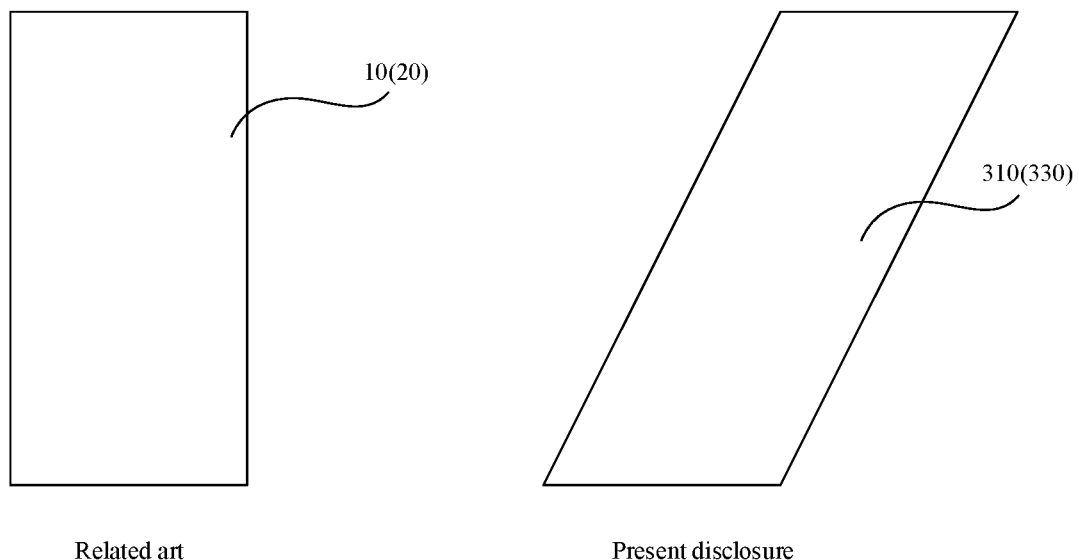
FIG. 1 is a schematic diagram showing a circuit bonding structure in the related art and a circuit bonding structure without deviation according to some exemplary arrangements of the present disclosure.

Example arrangements will now be described more fully with reference to the accompanying drawings. However, the arrangements can be implemented in a variety of forms and should not be construed as being limited to the examples set forth herein; rather, these arrangements are provided so that this disclosure will be more complete so as to convey the idea of the exemplary arrangements to those skilled in this art. The described features, structures, or characteristics in one or more arrangements may be combined in any suitable manner. In the following description, numerous specific details are set forth to provide a full understanding of the arrangements of the present disclosure. However, one skilled in the art will appreciate that the technical solutions of the present disclosure can be practiced when one or more of the described specific details may be omitted or other methods, components, devices, blocks, etc. may be employed. In other cases, well-known technical solutions are not shown or described in detail to avoid obscuring aspects of the present disclosure.

In addition, the drawings are merely schematic representations of the present disclosure and are not necessarily drawn to scale. The same reference numerals in the drawings denote the same or similar parts, and the repeated description thereof will be omitted. Some of the block diagrams shown in the figures are functional entities and do not necessarily correspond to physically or logically separate entities. These functional entities may be implemented in software, or implemented in one or more hardware modules or integrated circuits, or implemented in different networks and/or processor devices and/or microcontroller devices.

In a circuit bonding approach in the related art, a circuit bonding structure of a rectangular design of the same width and the same height is employed. Referring to the left figure of FIG. 1, in the related art, a carrying portion 10 and a bonding region 20 of a preset circuit board have a width of 15 μm and a height of 60 μm, and an effective contact area (see the shadow region in FIG. 1) of the carrying portion and the preset circuit board is 15*60=900 µm² in the case that there is no deviation between the carrying portion and the bonding region of the preset circuit board. The left figure in FIG. 1 shows the case there is no deviation between the carrying portion 10 and the bonding region 20 of the preset circuit board, that is the carrying portion 10 and the bonding region 20 of preset circuit board overlap each other.

However, due to equipment accuracy and tolerance factors of the materials, there is a certain deviation between the carrying portion and the bonding region of the preset circuit board during the actual bonding. When the preset circuit board is a flexible printed circuit (FPC), since the flexible printed circuit is a flexible material, a material expansion coefficient of the flexible printed circuit far exceeds a material expansion coefficient of the driving circuit, and the expansion is prone to occur during the manufacturing processes. Thus, dislocation or deviation between the carrying portion for carrying the driving circuit and the bonding region of the flexible printed circuit is easy to occur when the driving circuit is bonded to the flexible printed circuit. As shown in the left figure of FIG. 2, there is a certain deviation between the carrying portion and the bonding region of the preset circuit board, and therefore, the effective contact area between the carrying portion and the bonding region of the preset circuit board is reduced to 7.5*60=450 µm². If the effective contact area between the carrying portion and the preset circuit board is lower than the minimum contact area required for bonding, the package reliability cannot be guaranteed.

In this technical solution, it is necessary to increase the trace width and accuracy of the preset circuit board to a level equivalent to the driving circuit in a limited space. Due to equipment accuracy and tolerance factors of the materials, there is a certain deviation between the carrying portion and the bonding region of the preset circuit board.

Figure 2:
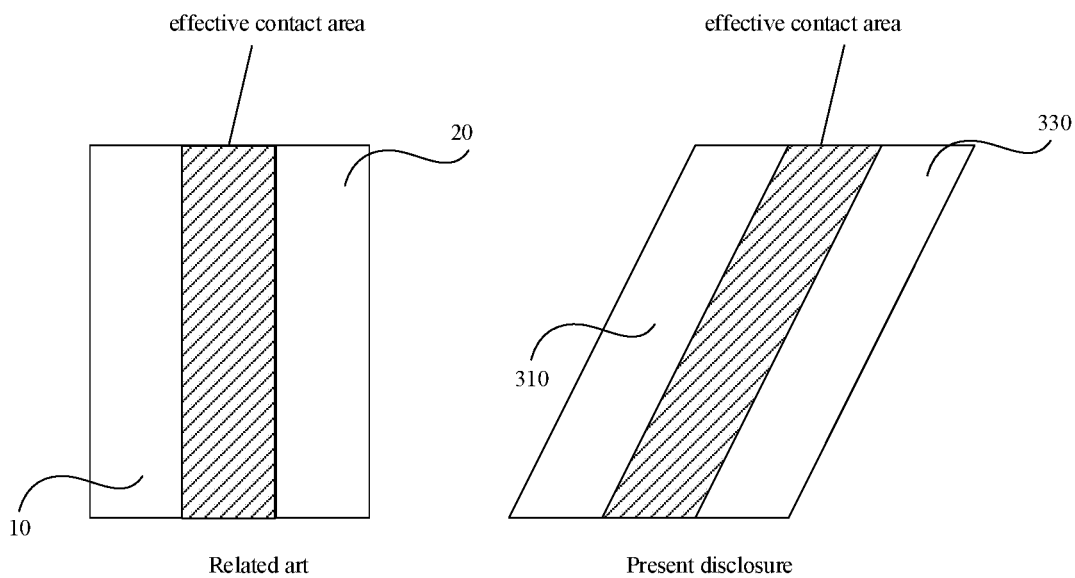
FIG. 2 is a schematic diagram showing a circuit bonding structure in the related art and a circuit bonding structure with deviation in a first direction according to some exemplary arrangements of the present disclosure.
Figure 3:
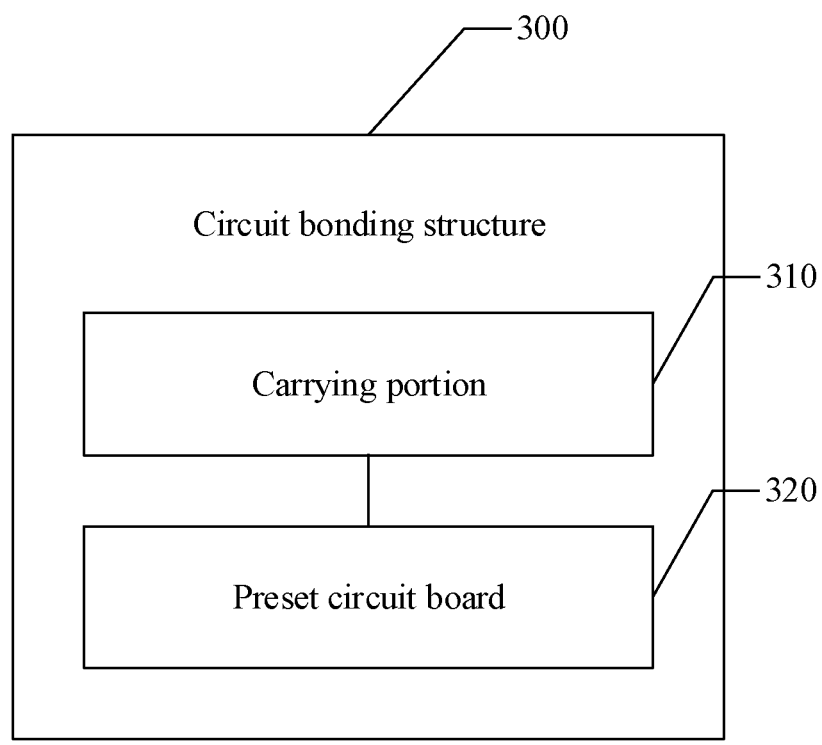
FIG. 3 is a schematic block diagram showing a circuit bonding structure according to some exemplary arrangements of the present disclosure.

In view of the above, an exemplary arrangement provides a circuit bonding structure. Referring to FIG. 3, the circuit bonding structure 300 may include: a carrying portion 310 for carrying a driving circuit and having two sides which are adjacent to each other and form a preset acute angle; a preset circuit board 320 having a bonding region 330 (the bonding region 330 is shown in FIG. 2) having two sides which are adjacent to each other and form a preset acute angle. The driving circuit is bonded to the bonding region by the carrying portion 310.

According to the circuit bonding structure in the present exemplary arrangement, on the one hand, by setting the shape of the carrying portion and the shape of the bonding region of the preset circuit board to have two sides which are adjacent to each other and form a preset acute angle, a position of the carrying portion is adjusted in a direction perpendicular to one of the two sides which form the preset acute angle when there is a deviation between the carrying portion and the bonding region of the preset circuit board. As compared with prior arts, the effective contact area of the carrying portion and the bonding region can be significantly increased, therefore efficiently correcting the deviation between the carrying portion and the bonding region, improving the packaging efficiency and reducing the occurrence of the deviation. On the other hand, the package reliability can be improved due to reduce of the occurrence of a deviation between the carrying portion and the bonding region of the preset circuit board.

Next, the circuit bonding structure in the present exemplary arrangement will be described in detail.

In an exemplary arrangement, the carrying portion 310 may be a chip on film (COF), but the carrying portion 310 in the exemplary arrangement of the present disclosure is not limited thereto. For example, the carrying portion 310 may also be a glass substrate or a printed circuit board, which are also within the protection scope of the present disclosure.

In an exemplary arrangement, the carrying portion 310 is configured to carry the driving circuit. The driving circuit may be a driving chip. In an exemplary arrangement, the driving circuit may be disposed on the carrying portion 310 by an anisotropic conductive film (ACF).

Further, in an exemplary arrangement, the range of the preset acute angle may be from 60 degrees to 80 degrees, but the range of the preset acute angle in the exemplary arrangement of the present disclosure is not limited thereto, and the present disclosure does not impose specific limitations on this.

In an exemplary arrangement, the vertical solution for the carrying portion carrying the driving circuit and the bonding region (in the related art) is changed to a tilting solution according to the arrangements disclosed herein. For example, referring to the right figures in FIGS. 1, 2 and the right figure in FIG. 4, each of the shape of the carrying portion 310 and the shape of the bonding region 330 of the preset circuit board is a parallelogram. As shown in FIG. 2, when there is a deviation between the carrying portion and the bonding region of the preset circuit board in a first direction, that is, a X direction, the effective contact area (see the shadow region) of the carrying portion and the bonding region in the vertical solution and the effective contact area between the carrying portion and the bonding region of the preset circuit board in the present exemplary arrangement are both reduced to 7.5*60=450 µm².

In order to improve the carrying portion and the bonding region of the preset circuit board, in the present exemplary arrangement, images of the carrying portion and the preset circuit board can be identified by a charge-coupled device (CCD), and the relative positions and effective contact area between the carrying portion and the bonding region of the preset circuit board may be determined according to the identified images of the carrying portion and the preset circuit board. When the effective contact area between the carrying portion and the bonding region of the preset circuit board is smaller than a preset value, for example, when the deviation occurs in the first direction (for example, the X direction) in FIG. 2, the carrying portion can be deviated in a direction perpendicular to one of the two sides which form the acute angle of the parallelogram, that is, in the Y direction, to increase the effective contact area and ensure the package reliability.

Figure 4:
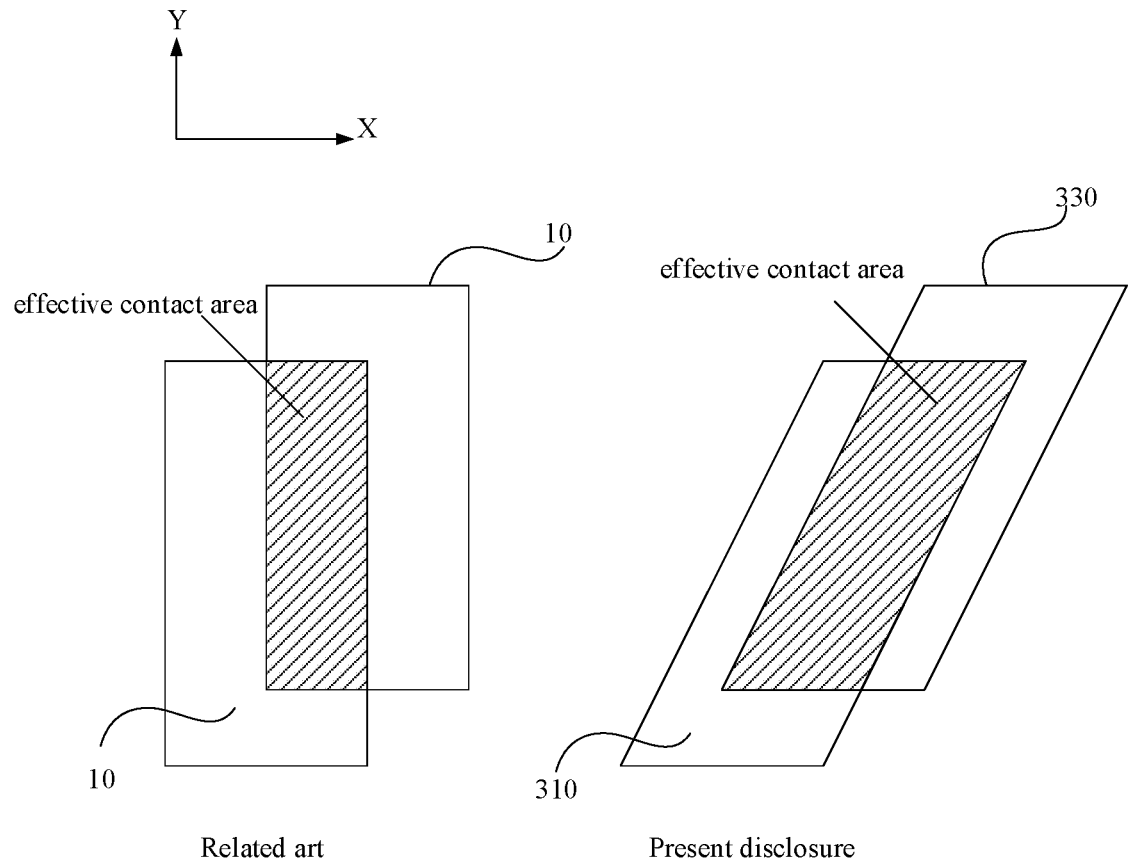
FIG. 4 is a schematic diagram showing a circuit bonding structure in the related art and a circuit bonding structure with deviation in a second direction according to some exemplary arrangements of the present disclosure.
Figure 6:
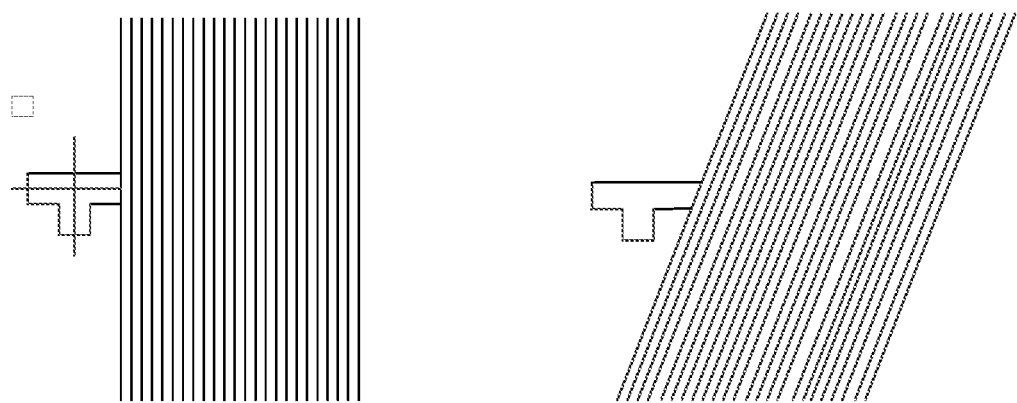
FIG. 6 is a comparison schematic diagram showing a chip on film according to some exemplary arrangements of the present disclosure and a chip on film in the prior art solution.

In the present exemplary arrangement, the specific deviation result that the carrying portion is deviated in a direction perpendicular to one of the two sides of the acute angle of the parallelogram, that is, in the Y direction can be referred to FIG. 4. In FIG. 4, the left figure shows the result of the deviation of the carrying portion in the Y direction in the conventional vertical solution, and the effective contact area of the carrying portion and the bonding region of the preset circuit board in the left figure of FIG. 4 is S1=7.5*50=375 µm². The right figure shows the result of the deviation of the carrying portion in the Y direction according to the present exemplary arrangement, and the effective contact area of the carrying portion and the bonding region of the preset circuit board in the right figure of FIG. 4 is S2=10*50=500 µm². Therefore, in the present exemplary arrangement, when the deviation amount is same as the deviation in the direction perpendicular to one of the two sides of the preset acute angle, that is, in the Y direction, the effective contact area of the carrying portion and the bonding region can be significantly increased, therefore efficiently correcting the deviation between the carrying portion and the bonding region, improving the packaging efficiency and reducing the occurrence of the deviation. The left figure of FIG. 6 shows a schematic view of the shape of a chip on film (COF) in a conventional vertical solution and the right figure shows a schematic view of the shape of a chip on film according to the present exemplary arrangement.

In an exemplary arrangement, the preset value of the effective contact area of the carrying portion and the bonding region of the preset circuit may be a minimum contact area determined according to the requirements of an anisotropic conductive film (ACF), but the preset value in the exemplary arrangement of the present disclosure is not limited thereto, for example, the preset value may alternatively be a value determined according to a trace width and accuracy of a preset circuit board and a trace width and accuracy of the carrying portion, which is also within the protection scope of the present disclosure.

Further, in an exemplary arrangement, the shape of the carrying portion and the bonding region may both be a parallelogram, but the shape of the carrying portion and the shape of the bonding region in the exemplary arrangement of the present disclosure may also be other shapes such as trapezoids or suitable shapes having acute angles, which are also within the protection scope of the present disclosure.

Further, in an exemplary arrangement, the preset circuit board may be a flexible circuit board, but the preset circuit board in the exemplary arrangement of the present disclosure is not limited thereto, and the preset circuit board may also be other circuit boards with bonding regions, which are not specifically limited in the present disclosure.

Figure 5:
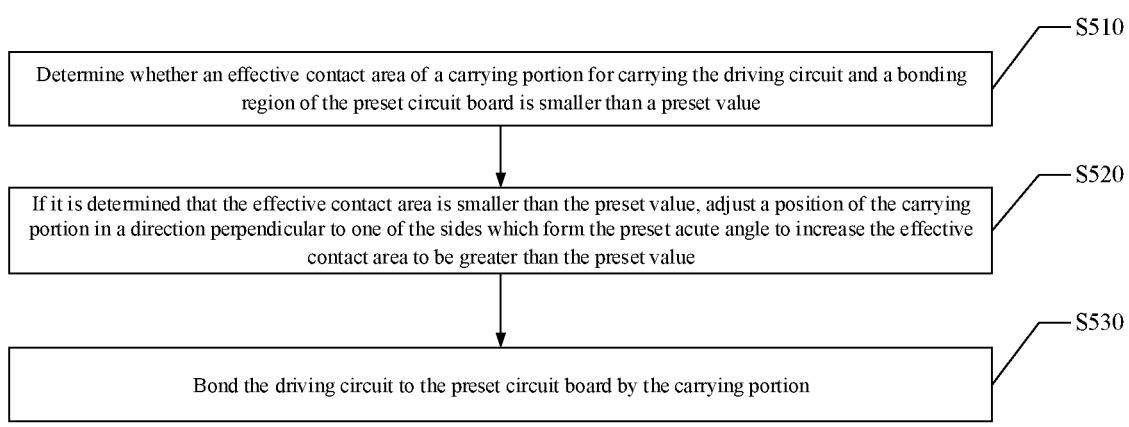
FIG. 5 is flow chart showing a circuit bonding method according to some exemplary arrangements of the present disclosure.

In addition, an exemplary arrangement provides a circuit bonding method. Referring to FIG. 5, the circuit bonding method may include the following:

In S510, whether an effective contact area of a carrying portion for carrying the driving circuit and a bonding region of the preset circuit board is smaller than a preset value is determined. Each of the carrying portion and the bonding region has two sides which are adjacent to each other and form a preset acute angle.

In S520, responsive to determining that the effective contact area is smaller than the preset value, a position of the carrying portion is adjusted in a direction perpendicular to one of the sides which form the preset acute angle to increase the effective contact area to be greater than the preset value.

In S530, the driving circuit is bonded to the preset circuit board by the carrying portion.

According to the circuit bonding method of the present exemplary arrangement, when the effective contact area of the carrying portion and the bonding region of the preset circuit board is smaller than the preset value, the position of the carrying portion is adjusted in a direction perpendicular to one of the sides which form the preset acute angle. The deviation amount is same as the deviation in a direction perpendicular to a side of the preset acute angle, the effective contact area between the carrying portion and the preset circuit board can be significantly increased as compared with the prior art, therefore efficiently improving the effective contact area of the carrying portion and the bonding region of the preset circuit board and improving the manufacturing efficiency. On the other hand, the package reliability can be improved due to improving of the effective contact area of the carrying portion and the bonding region of the preset circuit board.

Next, the circuit bonding method in the present exemplary arrangement will be described in detail.

In S510, whether an effective contact area of a carrying portion for carrying the driving circuit and a bonding region of the preset circuit board is smaller than a preset value is determined. Each of the carrying portion and the bonding region has two sides which are adjacent to each other and form a preset acute angle.

In an exemplary arrangement, determining whether an effective contact area of a carrying portion for carrying the driving circuit and a bonding region of the preset circuit board is smaller than a preset value may include: identifying images of the carrying portion and the bonding region of the preset circuit board by a charge-coupled device; and determining whether the effective contact area of the carrying portion and the bonding region of the preset circuit board is smaller than the preset value according to the images. In an exemplary arrangement of the present disclosure, images of the carrying portion and the preset circuit board may also be identified by other image recognition technologies, which are also within the protection scope of the present disclosure.

In an exemplary arrangement, the preset value of the effective contact area of the carrying portion and the bonding region of the preset circuit may be a minimum contact area determined according to the requirements of an anisotropic conductive film (ACF), but the preset value in the exemplary arrangement of the present disclosure is not limited thereto, for example, the preset value may also be a value determined according to a trace width and accuracy of a preset circuit board and a trace width and accuracy of the carrying portion, which also fall within the protection scope of the present disclosure.

Further, in an exemplary arrangement, the range of the preset acute angle may be from 60 degrees to 80 degrees, but the range of the preset acute angle in the exemplary arrangement of the present disclosure is not limited thereto, and the present disclosure does not impose specific limitations on this.

Next, in S520, responsive to determining that the effective contact area is smaller than the preset value, a position of the carrying portion is adjusted in a direction perpendicular to one of the sides which form the preset acute angle to increase the effective contact area to be greater than the preset value.

In the exemplary arrangements, a position of the carrying portion is adjusted in a direction perpendicular to one of the two sides which form the preset acute angle when there is deviation between the carrying portion and the bonding region of the preset circuit board, and the effective contact area of the carrying portion and the bonding region can be significantly increased as compared with the prior art, therefore efficiently correcting the deviation between the carrying portion and the bonding region, improving the packaging efficiency and reducing the occurrence of the deviation.

In S530, the driving circuit is bonded to the preset circuit board by the carrying portion.

In the present exemplary arrangement, the carrying portion may be a chip on film, but the carrying portion in the exemplary arrangement of the present disclosure is not limited thereto, for example, the carrying portion may also be a glass substrate or a printed circuit board, which are also within the protection scope of the present disclosure.

In addition, in an exemplary arrangement, the preset circuit board may be a flexible circuit board, but the preset circuit board in the exemplary arrangement of the present disclosure is not limited thereto, and the preset circuit board may also be other circuit boards with bonding regions, which are not specifically limited in the present disclosure.

Further, in an exemplary arrangement, the shape of the carrying portion and the shape of the bonding region may be a parallelogram, but the shape of the carrying portion and the shape of the bonding region in the exemplary arrangement of the present disclosure may also be other shapes such as trapezoids or suitable shapes having acute angles, which are also within the protection scope of the present disclosure.

In addition, an exemplary arrangement provides a display device. The display device includes a circuit bonding structure according to the above exemplary arrangements. Since the display device in the present exemplary arrangement employs the above circuit bonding structure, it has at least all the advantages corresponding to the circuit bonding structure. In an exemplary arrangement, the display device may be any product or component having a display function, such as an OLED panel, a mobile phone, a tablet computer, a television, a display, a notebook computer, a digital camera, and so on, and the present disclosure does not impose specific limitations on this.

Other arrangements of the present disclosure will be readily apparent to those skilled in the art upon consideration of the specification and practice of the disclosure herein. The present disclosure is intended to cover any variations, uses, or adaptations, which are in accordance with the general principles of the present disclosure and include common general knowledge or conventional technical means in the art that are not disclosed in the present disclosure. The specification and arrangements are illustrative, and the truth scope and spirit of the present disclosure are defined by appended claims.

It should be understood that the present disclosure is not limited to the precise structures that have been described above and shown in the drawings, and various modifications and changes can be made without departing from the scope of the present disclosure. The scope of the present disclosure is defined by the appended claims.

What is claimed is:

1. A circuit bonding method for bonding a driving circuit to a preset circuit board, comprising:

determining whether an effective contact area of a carrying portion for carrying the driving circuit and a bonding region of the preset circuit board is smaller than a preset value, wherein each of the carrying portion and the bonding region has two sides which are adjacent to each other and form a preset acute angle;

if it is determined that the effective contact area is smaller than the preset value, adjusting a position of the carrying portion in a direction perpendicular to one of the sides which form the preset acute angle to increase the effective contact area to be greater than the preset value; and bonding the driving circuit to the preset circuit board by the carrying portion; and wherein determining whether an effective contact area of a carrying portion for carrying the driving circuit and a bonding region of the preset circuit board is smaller than a preset value, comprising:

identifying images of the carrying portion and the bonding region of the preset circuit board by a charge-coupled device; and determining whether the effective contact area of the carrying portion and the bonding region of the preset circuit board is smaller than the preset value according to the images.

2. The circuit bonding method according to claim 1, wherein the preset acute angle is in a range of 60 degrees to 80 degrees.

3. The circuit bonding method according to claim 2, wherein the carrying portion is a chip on film, and the preset circuit board is a flexible circuit board.

4. The circuit bonding method according to claim 1, wherein each of a shape of the carrying portion and a shape of the bonding region is a parallelogram.

5. The circuit bonding method according to claim 4, wherein the carrying portion is a chip on film, and the preset circuit board is a flexible circuit board.

6. The circuit bonding method according to claim 1, wherein the carrying portion is a chip on film, and the preset circuit board is a flexible circuit board.

* * * * *